United States Patent
Cheng et al.

(10) Patent No.: US 10,326,019 B2
(45) Date of Patent: Jun. 18, 2019

(54) FULLY-DEPLETED CMOS TRANSISTORS WITH U-SHAPED CHANNEL

(71) Applicant: International Business Machines Corporation, Armonk, NY (US)

(72) Inventors: Kangguo Cheng, Schenectady, NY (US); Robert H. Dennard, Croton-on-Hudson, NY (US); Bruce B. Doris, Slingerlands, NY (US); Terence B. Hook, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 6 days.

(21) Appl. No.: 15/275,800

(22) Filed: Sep. 26, 2016

(65) Prior Publication Data

US 2018/0090614 A1    Mar. 29, 2018

(51) Int. Cl.
    *H01L 29/78*    (2006.01)
    *H01L 29/06*    (2006.01)
    *H01L 29/417*    (2006.01)
    *H01L 29/66*    (2006.01)
    *H01L 21/762*    (2006.01)
    *H01L 21/283*    (2006.01)
    *H01L 29/08*    (2006.01)

(52) U.S. Cl.
    CPC ........ *H01L 29/7833* (2013.01); *H01L 21/283* (2013.01); *H01L 21/7624* (2013.01); *H01L 29/0649* (2013.01); *H01L 29/0847* (2013.01); *H01L 29/41783* (2013.01); *H01L 29/66492* (2013.01); *H01L 29/66545* (2013.01); *H01L 29/66621* (2013.01); *H01L 29/7834* (2013.01)

(58) Field of Classification Search
    CPC ........... H01L 29/7833; H01L 21/26506; H01L 21/283; H01L 21/7624; H01L 29/0649; H01L 29/41783; H01L 29/66492
    USPC ......................................................... 257/346
    See application file for complete search history.

(56) References Cited

U.S. PATENT DOCUMENTS

| | | | | |
|---|---|---|---|---|
| 5,814,858 | A * | 9/1998 | Williams | ............ H01L 29/7828 257/328 |
| 6,127,699 | A * | 10/2000 | Ni | ...................... H01L 29/66613 257/302 |
| 6,509,234 | B1 * | 1/2003 | Krivokapic | ....... H01L 29/42384 257/E21.415 |
| 6,939,751 | B2 * | 9/2005 | Zhu | ........................ H01L 21/84 257/E21.415 |
| 7,034,361 | B1 * | 4/2006 | Yu | ....................... H01L 29/4908 257/349 |
| 7,041,538 | B2 * | 5/2006 | Ieong | ................ H01L 29/66545 257/E21.415 |
| 7,102,232 | B2 | 9/2006 | Clevenger et al. | |

(Continued)

*Primary Examiner* — Ori Nadav
(74) *Attorney, Agent, or Firm* — Scully, Scott, Murphy & Presser, P.C.; L. Jeffrey Kelly, Esq.

(57) ABSTRACT

A structure capable of effectively preventing dopant diffusion from source/drain regions into an underlying semiconductor-on-insulator (SOI) layer of fully-depleted SOI transistors with U-shaped channels is provided. By inserting a dopant diffusion barrier layer between an SOI layer of an SOI substrate and a doped extension layer from which source/drain extension regions are derived, the undesired dopant diffusion from the source/drain extension regions into the underlying SOI layer can be prevented.

14 Claims, 4 Drawing Sheets

(56) References Cited

U.S. PATENT DOCUMENTS

| | | | |
|---|---|---|---|
| 7,217,602 B2* | 5/2007 | Koh | H01L 29/458 257/E21.415 |
| 7,252,875 B2 | 8/2007 | Cohen et al. | |
| 7,402,532 B2 | 7/2008 | Clevenger et al. | |
| 7,652,332 B2* | 1/2010 | Cartier | H01L 21/28079 257/347 |
| 7,820,559 B2 | 10/2010 | Clevenger et al. | |
| 8,716,090 B2 | 5/2014 | Qin et al. | |
| 9,117,791 B2* | 8/2015 | Glass | H01L 21/28512 |
| 2004/0115407 A1 | 6/2004 | Cohen et al. | |
| 2005/0167741 A1* | 8/2005 | Divakaruni | H01L 21/28114 257/328 |
| 2006/0270133 A1* | 11/2006 | Yasutake | H01L 21/82380 438/197 |
| 2011/0291196 A1* | 12/2011 | Wei | H01L 29/66795 257/365 |
| 2012/0261754 A1* | 10/2012 | Cheng | H01L 29/66772 257/347 |
| 2013/0082308 A1* | 4/2013 | Cheng | H01L 29/7834 257/288 |
| 2013/0161745 A1* | 6/2013 | Ando | H01L 29/66537 257/347 |
| 2013/0187229 A1* | 7/2013 | Cheng | H01L 29/772 257/347 |
| 2013/0316509 A1 | 11/2013 | Qin et al. | |
| 2014/0061734 A1* | 3/2014 | Basker | H01L 29/66795 257/288 |
| 2015/0287628 A1 | 10/2015 | You et al. | |

\* cited by examiner

FULLY-DEPLETED CMOS TRANSISTORS WITH U-SHAPED CHANNEL

BACKGROUND

The present application relates to semiconductor device fabrication, and more particularly to fabrication of fully-depleted metal oxide semiconductor field effect transistor (MOSFETs) with U-shaped channels.

Short channel effects in bulk MOSFETs occur when the channel length is on the same order of magnitude as the combined depletion widths of the source region and the drain region (collectively referred to herein source/drain regions). Short channel effects can undesirably impact device characteristics, such as shifting the threshold voltage.

Fully-depleted MOSFETs fabricated on ultrathin semiconductor-on-insulator (SOI) layers have received significant attention due to better short channel behavior. Fully-depleted SOI MOSFETs with U-shaped channels have been developed to allow continued device scaling while minimizing the impact of short channel effects. A challenge in fabricating fully-depleted SOI MOSFETs with U-shaped channels is the undesired dopant diffusion from each source/drain region into the underlying SOI layer. Therefore, there is need for minimizing the undesired dopant diffusion in fully-depleted SOI MOSFETs with U-shaped channels.

SUMMARY

The present application provides a structure capable of effectively preventing dopant diffusion from source/drain regions into an underlying SOI layer of fully-depleted SOI MOSFETs with U-shaped channels. The undesired dopant diffusion can be avoided by inserting a dopant diffusion barrier layer between the SOI layer and a doped extension layer from which the source/drain extension regions are derived.

In one aspect of the present application, a semiconductor structure is provided. The semiconductor structure includes a functional gate stack extending partially into a semiconductor-on-insulator (SOI) layer of an SOI substrate and surrounded by an upper portion of the SOI layer. Source/drain regions are located on opposite sides of the functional gate stack. The source/drain regions include dopant diffusion barrier portions contacting top surfaces of portions of the SOI layer that are not covered by the functional gate stack.

In another aspect of the present application, a method of forming a semiconductor structure is provided. The method includes first forming a dopant diffusion barrier layer over a semiconductor-on-insulator (SOI) layer of an SOI substrate. A doped extension layer is then formed over the dopant diffusion barrier layer. Next, a sacrificial gate structure is formed over a portion of the doped extension layer. The sacrificial gate structure includes a sacrificial gate stack and a gate spacer present on sidewalls of the sacrificial gate stack. After forming raised source/drain regions over portions of the doped extension layer that are not cover by the sacrificial gate structure, an interlevel dielectric (ILD) layer is formed over the raised source/drain regions to laterally surround the sacrificial gate structure. The sacrificial gate stack is subsequently removed to form a gate cavity. Next, portions of the doped extension layer, the dopant diffusion barrier layer and the SOI layer are removed to provide an opening underneath the gate cavity. The opening extends through the doped extension layer and the dopant diffusion barrier layer and partially into the SOI layer to expose a recessed surface of the SOI layer at a bottom of the opening. Subsequently a functional gate stack is formed in the gate cavity and the opening.

DETAILED DESCRIPTION

Figure 1:
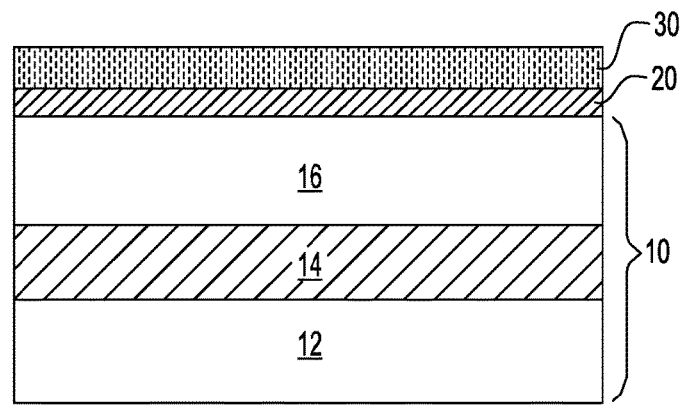
FIG. 1 is a cross-sectional view of an exemplary semiconductor structure after forming a material stack of a dopant diffusion barrier layer and a doped extension layer over an SOI layer of an SOI substrate according to an embodiment of present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring to FIG. 1, an exemplary semiconductor structure according to an embodiment of the present application includes a substrate 10 and a material stack, which includes a dopant diffusion barrier layer 20 and a doped extension layer 30, formed on top of the substrate 10.

In one embodiment and as shown in FIG. 1, the substrate 10 can be a semiconductor-on-insulator (SOI) substrate which includes, from bottom to top, a handle substrate 12, a buried insulator layer 14 and an SOI layer 16.

The handle substrate 12 can include a semiconductor material such as, for example, Si, Ge, SiGe, SiC, SiGeC or an III-V compound semiconductor such as, for example, InAs, GaAs or InP. The handle substrate 12 provides mechanical support to the buried insulator layer 14 and the SOI layer 16. The thickness of the handle substrate 12 can be from 30 µm to about 2 mm, although lesser and greater thicknesses can also be employed.

The buried insulator layer 14 can include a dielectric material such as silicon oxide, silicon nitride, silicon oxynitride, boron nitride or a combination thereof. In one embodiment, the buried insulator layer 14 may be formed by a deposition process, such as chemical vapor deposition (CVD) or physically vapor deposition (PVD). In another embodiment, the buried insulator layer 14 may be formed using a thermal growth process, such as thermal oxidation, to convert a surface portion of the handle substrate 12 into the buried insulator layer 14. The thickness of the buried insulator layer 14 can be from 15 nm to 200 nm, although lesser and greater thicknesses can also be employed.

The SOI layer 16 can include a semiconductor material such as, for example, Si, Ge, SiGe, SiC, SiGeC, and an III-V compound semiconductor such as, for example, InAs, GaAs or InP. The semiconductor materials of the SOI layer 16 and the handle substrate 12 may be the same or different. Typically, each of the handle substrate 12 and the SOI layer 16 comprises a single crystalline semiconductor material, such as, for example, single crystalline silicon. In one embodiment, the SOI layer 16 can be intrinsic (i.e., undoped). In another embodiment, the SOI layer can contain dopants of a first conductivity type that can be p-type or n-type. The term "p-type" refers to the addition of impurities to an intrinsic semiconductor that creates deficiencies of valence electrons. Examples of p-type dopants, i.e., impurities, include, but are not limited to, boron, aluminum, gallium and indium. The term "n-type" refers to the addition of impurities that contributes free electrons to an intrinsic semiconductor. Examples of n-type dopants, i.e., impurities, include, but are not limited to, antimony, arsenic and phosphorous. If doped, the dopant concentration in the SOI layer 16 is less than $1\times10^{18}$ atoms/cm$^3$.

The SOI layer 16 can be formed by any suitable technique. In one embodiment, the SOI layer 16 can be formed using a smart cut process where two semiconductor wafers are bonded together with an insulator in between. The SOI layer 16 can be thinned to a desired thickness by planarization, grinding, wet etch, dry etch, oxidation followed by oxide etch, or any combination thereof. In one embodiment, the SOI layer 16 is an extremely thin SOI (ETSOI) layer with a thickness ranging from 8 nm to 20 nm.

The dopant diffusion barrier layer 20 that is formed on the top surface of the SOI layer 16 blocks diffusion of dopants from the doped extension layer 30 into the SOI layer 16 in downstream fabrication processes. The dopant diffusion barrier layer 30 may include a carbon doped semiconductor material. In one embodiment, the dopant diffusion barrier layer 20 is composed of carbon doped silicon (Si:C). The carbon concentration in the Si:C can be from 0.1% to 2% in atomic concentration. The dopant diffusion barrier layer 20 can be formed utilizing an epitaxial growth process such as, for example, ultrahigh vacuum chemical vapor deposition (UHVCVD), rapid thermal chemical vapor deposition (RTCVD), metalorganic chemical vapor deposition (MOCVD), low-pressure chemical vapor deposition (LP-CVD), limited reaction processing CVD (LRPCVD) or molecular beam epitaxy (MBE). Epitaxial materials may be grown from gaseous or liquid precursors using vapor-phase epitaxy (VPE), molecular-beam epitaxy (MBE), liquid-phase epitaxy (LPE) or other suitable process. The term "epitaxial growth and/or deposition" means the growth of a semiconductor material on a deposition surface of a semiconductor material, in which the semiconductor material being grown has the same (or nearly the same) crystalline characteristics as the semiconductor material of the deposition surface. The dopant diffusion barrier layer 20 thus has a same crystal orientation as that of the underlying SOI layer 16 (i.e., epitaxially aligned with the SOI layer 16). In one embodiment and when the SOI layer 16 includes single crystalline Si, the dopant diffusion barrier layer 20 can include single crystalline Si:C. The thickness of the dopant diffusion barrier layer 20 can be from 2 nm to 10 nm, although lesser and greater thicknesses can also be employed.

The doped extension layer 30 from which a source extension region and a drain extension region (collectively referred to as source/drain extension regions) of a FET are derived can include a doped semiconductor material containing dopants of a second conductor type which is opposite to the first conductivity type if the SOI layer 16 is doped. For example, if the first conductivity type is p-type, the second conductivity type is n-type, and vice versa. The semiconductor material that can be employed in the present application as the doped extension layer 30 includes, but not limited to Si, SiGe, Ge and a compound semiconductor material such as, for example, InGaAs. In one embodiment, the doped extension layer 30 is composed of boron doped SiGe for a p-type FET. In another embodiment, the doped extension layer 30 is composed of phosphorus doped Si for an n-type FET.

The doped extension layer 30 can be formed utilizing an epitaxial growth process such as, for example, UHVCVD, RTCVD, MOCVD, LPCVD, LRPCVD or MBE. Epitaxial materials may be grown from gaseous or liquid precursors using VPE, MBE, LPE or other suitable process. The doped extension layer 30 has a same crystalline orientation as that of the underlying dopant diffusion barrier layer 20. The thickness of the doped extension layer 30 can be from 3 nm to 10 nm, although lesser and greater thicknesses can also be employed. The doped extension layer 30 can be doped in-situ during the epitaxial growth process. The dopant concentration in the doped extension layer 30 is typically greater than $1\times10^{20}$ atoms/cm$^3$. The doped extension layer 30 and the diffusion barrier layer 20 can be grown in two separate processes. Alternatively, they can be grown sequentially by an integrated epitaxy process.

Figure 2:
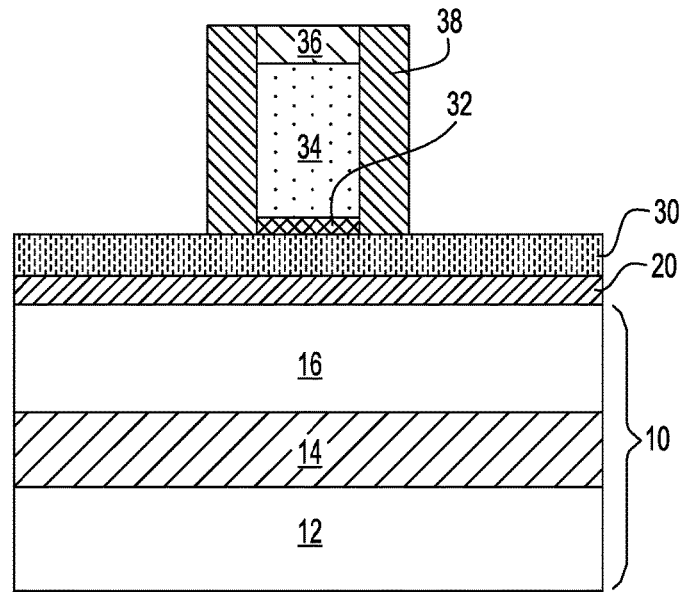
FIG. 2 is a cross-sectional view of the exemplary semiconductor structure of FIG. 1 after forming a sacrificial gate structure on a top surface of the doped extension layer.

Referring to FIG. 2, a sacrificial gate structure is formed on the top surface of the doped extension layer 30. Although a single sacrificial gate structure 30 is described and illustrated, the present application can be employed when a plurality of sacrificial gate structures are formed. As shown, the sacrificial gate structure includes a sacrificial gate stack of, from bottom to top, a sacrificial gate dielectric 32, a sacrificial gate conductor 34 and a sacrificial gate cap 36, and a gate spacer 38 present on sidewalls of the sacrificial gate stack (32, 34, 36). In some embodiments of the present application, the sacrificial gate dielectric 32 and/or the sacrificial gate cap 36 can be omitted.

The sacrificial gate stack (32, 34, 36) can be formed by first providing a material stack (not shown) that includes, from bottom to top, a sacrificial gate dielectric layer, a sacrificial gate conductor layer and a sacrificial gate cap layer over the doped extension layer 30. In some embodiments of the present application and as mentioned above, the sacrificial gate dielectric layer can be omitted. When present, the sacrificial gate dielectric layer includes a dielectric material such as an oxide or a nitride. In one embodiment, the sacrificial gate dielectric layer is composed of silicon oxide, silicon nitride or silicon oxynitride. The sacrificial gate dielectric layer can be formed by a conventional deposition process, including but not limited to, CVD or PVD. The sacrificial gate dielectric layer can also be formed by conversion of a surface portion of the doped extension layer 30. The thickness of the sacrificial gate dielectric layer can be from 1 nm to 10 nm, although lesser and greater thicknesses can also be employed.

The sacrificial gate conductor layer can include a semiconductor material such as amorphous silicon, polycrystalline silicon (polysilicon) or a silicon-containing semiconductor alloy such as a silicon-germanium alloy. The sacrificial gate conductor layer can be formed using CVD or PECVD. The thickness of the sacrificial gate conductor layer can be from 20 nm to 300 nm, although lesser and greater thicknesses can also be employed.

The sacrificial gate cap layer may include a dielectric material such as an oxide, a nitride or an oxynitride. In one embodiment, the sacrificial gate cap layer is comprised of silicon nitride. The sacrificial gate cap layer can be formed utilizing a conventional deposition process including, for example, CVD and PECVD. The thickness of the sacrificial gate cap layer can be from 10 nm to 200 nm, although lesser and greater thicknesses can also be employed.

The material stack can then be patterned by lithography and etching to form the sacrificial gate stacks (32, 34, 36). Specifically, a photoresist layer (not shown) is applied over the topmost surface of the material stack and is lithographically patterned by lithographic exposure and development. The pattern in the photoresist layer is transferred into the material stack by an etch, which can be an anisotropic etch such as reactive ion etch (RIE). The remaining portion of the material stack after the pattern transfer constitutes the sacrificial gate stack (32, 34, 36). The remaining portion of the photoresist layer may be subsequently removed by, for example, ashing. Alternatively, the material stack can be patterned by sidewall image transfer (SIT) or any other suitable patterning techniques.

The gate spacer 38 may include a dielectric material such as, for example, an oxide, a nitride, an oxynitride, silicon boron carbon nitride (SiBCN), or silicon carbon oxynitride (SiOCN), silicon carbon oxide (SiCO), or any suitable combination thereof. The gate spacer 38 can be formed by first conformally depositing a gate spacer material layer (not shown) on exposed surfaces of the sacrificial gate stack (32, 34, 36) and the doped extension layer 30 and then etching the gate spacer material layer to remove horizontal portions of the gate spacer material layer. The gate spacer material layer can be provided by a conformal deposition process including, for example, atomic layer deposition (ALD), CVD, PECVD or PVD. The etching of the conformal gate spacer material layer may be performed by a dry etch process such as, for example, RIE. The remaining portion of the gate spacer material layer constitutes the gate spacer 38. The width of the gate spacer 38, as measured at the base of the gate spacer 38 can be from 5 nm to 100 nm, although lesser and greater widths can also be employed.

In some embodiments of the present application, portions of the doped extension layer 30 that are not covered by the sacrificial gate structure (32, 34, 36, 38) may be vertically recessed relative to the interface between the top surface of the doped extension layer 30 and the gate spacer 38 during the spacer RIE or the post-cleaning process (not shown).

Figure 3:
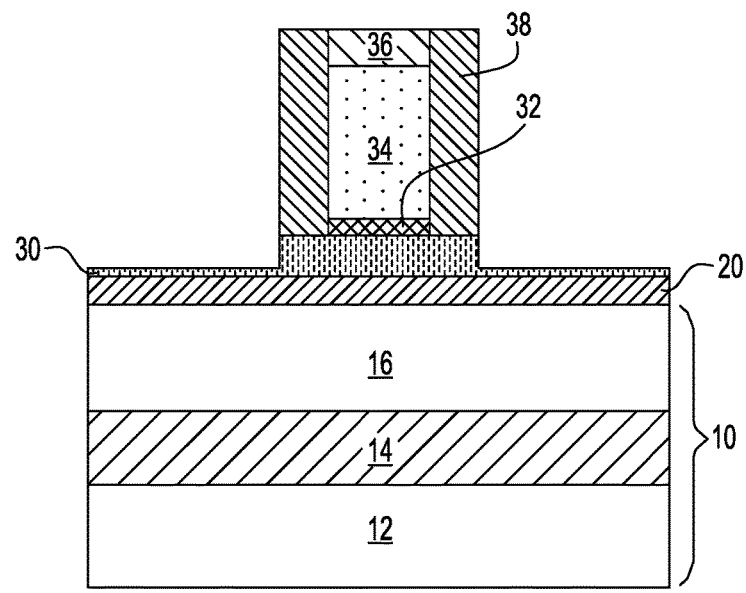
FIG. 3 is cross-sectional view of the exemplary semiconductor structure of FIG. 2 after optionally recessing portions of the doped extension layer that are not covered by the sacrificial gate structure.

Referring to FIG. 3, optionally portions of the doped extension layer 30 that are not covered by the sacrificial gate structure (32, 34, 36, 38) can be recessed by another anisotropic etch. The anisotropic etch can be a dry etch such as, for example, RIE or a wet etch that removes the semiconductor material of the doped extension layer 30 selective to the dielectric materials of the sacrificial gate cap 36, the sacrifice gate spacer 38 and in some cases, the semiconductor material of the dopant diffusion barrier layer 20. In one embodiment and as shown in FIG. 3, the depth of recess does not exceed the thickness of the doped extension layer 30. In this case, the remaining portion of the doped extension layer 30 has recessed surfaces vertically offset and located beneath the topmost surface of the doped extension layer 30. In another embodiment, the anisotropic etch may be continued to completely removed the exposed portions of the doped extension layer 30. In this case, sidewalls of the remaining portion of the doped extension layer 30 are vertically coincident with outer sidewalls of the gate spacer 38. Portions of the dopant diffusion barrier layer 20 that are not covered by the gate structure (32, 34, 36, 38) are thus exposed (not shown).

Figure 4:
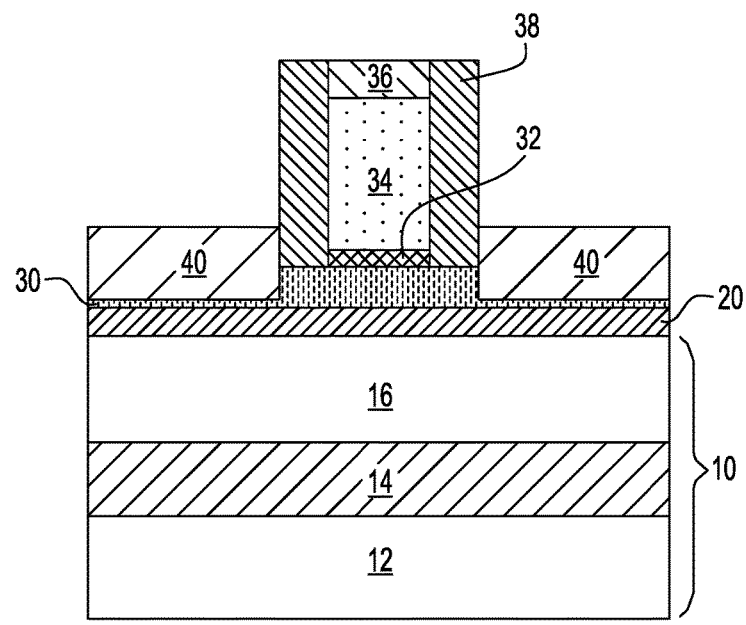
FIG. 4 is a cross-sectional view of the exemplary semiconductor structure of FIG. 3 after forming raised source/drain regions on recessed surfaces of the doped extension layer.

Referring to FIG. 4, a raised source region and a raised drain region (collectively referred to raised source/drain regions 40) are formed on the recessed surfaces of the doped extension layer 30. The raised source/drain regions 40 include a doped semiconductor material containing dopants of the same conductivity type as that of the dopants in the doped extension layer 30. The semiconductor material that provides the raised source/drain regions 40 may be the same as, or different from, the semiconductor that provides the doped extension layer 30. For example, the raised source/drain regions 40 can include Si, Ge or SiGe. In one embodiment, the raise source/drain regions 40 are composed of boron doped SiGe. In another embodiment, the raise source/drain regions 40 are composed of phosphorus doped Si.

The raised source/drain regions 40 can be formed by selective epitaxy. During the selective epitaxy process, the deposited semiconductor material grows only on semiconductor surfaces, i.e., exposed surfaces of the doped extension layer 30 and does not grow on dielectric surfaces, such as surfaces of the sacrificial gate cap 36 and the gate spacer 38. The raised source/drain regions 40 can be formed as doped semiconductor material portions by in-situ doping, or can be formed as intrinsic semiconductor material portions and subsequently doped with dopants by ion implantation or plasma doping.

Figure 5:
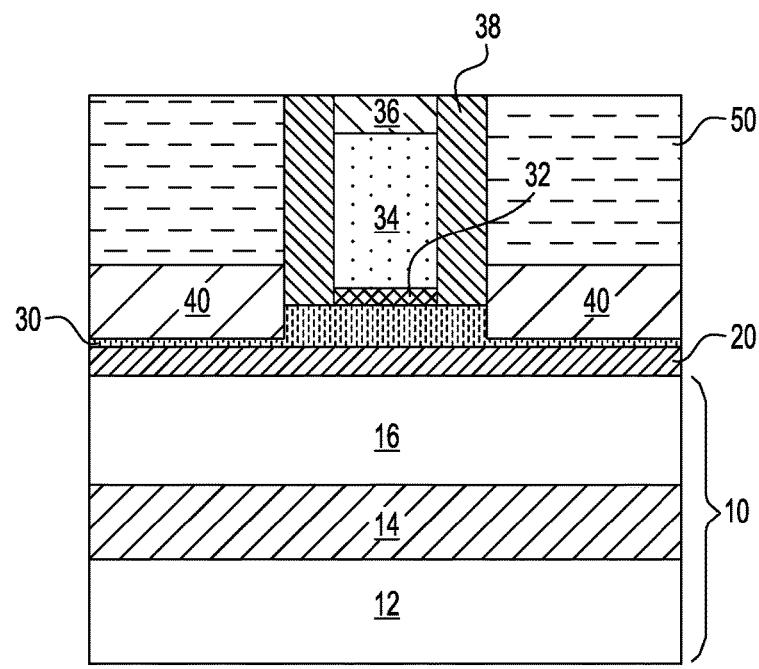
FIG. 5 is a cross-sectional view of the exemplary semiconductor structure of FIG. 4 after forming an interlevel dielectric layer over the raised source/drain regions.

Referring to FIG. 5, an interlevel dielectric (ILD) layer 50 is formed over the raised source/drain regions 40 and laterally surrounds the sacrificial gate structure (32, 34, 36, 38). In some embodiments of the present application, the ILD layer 50 is composed of a dielectric material that can be easily planarized. For example, the ILD layer 50 can include a doped silicate glass, an undoped silicate glass (silicon oxide), an organosilicate glass (OSG), a porous dielectric material or amorphous carbon. In some embodiment, a dielectric liner (e.g., silicon nitride, not shown) can be deposited before the deposition of the oxide. The ILD layer 50 can be deposited using a conventional deposition process, such as, for example, CVD, PECVD or spin coating and subsequently planarized, for example, by CMP using the top surface of the sacrificial gate cap 36 as a planarization stop. The top surface of the ILD layer 50 thus is coplanar with the top surface of the sacrificial gate cap 36.

Figure 6:
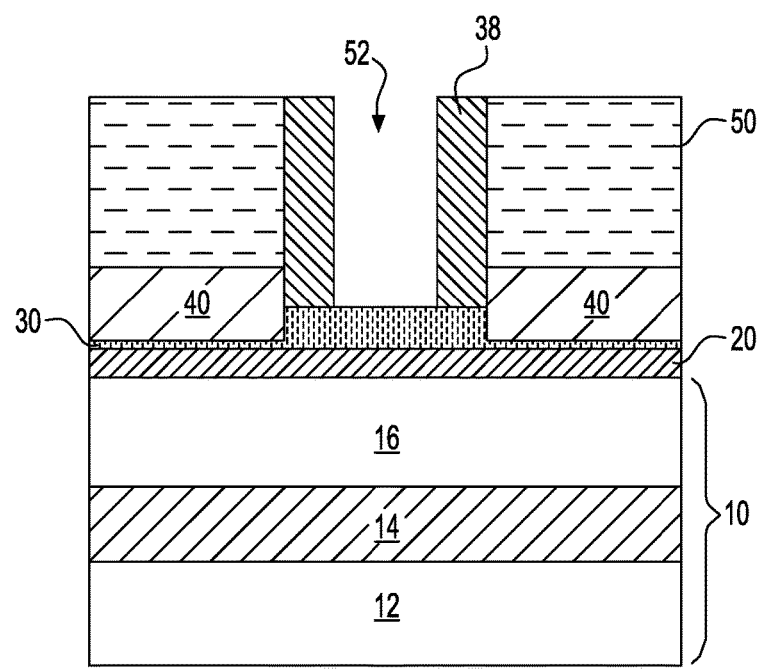
FIG. 6 is a cross-sectional view of the exemplary semiconductor structure of FIG. 5 after removing a sacrificial gate stack in the sacrificial gate structure to provide a gate cavity.

Referring to FIG. 6, the sacrificial gate stack (32, 34, 36) is removed to provide a gate cavity 52. Various components of the sacrificial gate stack (32, 34, 36) can be removed selectively to the semiconductor material of the doped extension layer 30 and the dielectric materials of the gate spacer 38 and the ILD layer 50 utilizing at least one etch. The at least one etch can be a wet etch such as an ammonia etch or a dry etch such as RIE. The gate cavity 52 is thus formed within a volume from which the sacrificial gate stack (32, 34, 36) is removed and is laterally confined by the inner sidewalls of the gate spacer 38. The gate cavity 52 exposes a portion of the doped extension layer 30.

Figure 7:
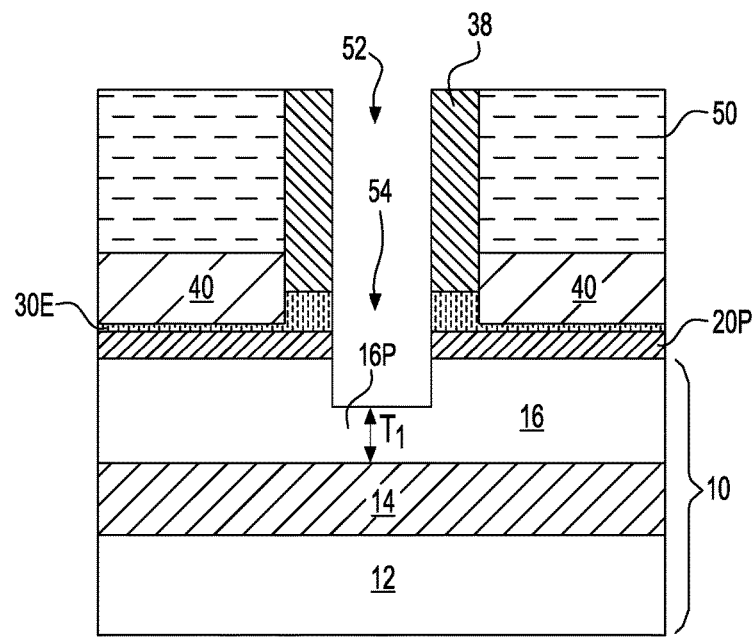
FIG. 7 is a cross-sectional view of the exemplary semiconductor structure of FIG. 6 after removing portions of the doped extension layer, the dopant diffusion barrier layer and the SOI layer to provide an opening underneath the gate cavity.

Referring to FIG. 7, portions of the doped extension layer 30, the dopant diffusion barrier layer 20 and the SOI layer 16 that are located beneath the gate cavity 52 are removed by an anisotropic etch. The anisotropic etch can be a dry etch such as, for example, RIE or a wet etch that removes the semiconductor materials of the doped extension layer 30, the dopant diffusion barrier layer 20 and the SOI layer 16 selective to the dielectric materials of the gate spacer 38 and the ILD layer 50. An opening 54 is thus formed underneath the gate cavity 52. The opening 54 extends through the doped extension layer 30 and the dopant diffusion barrier layer 20 and partially into the SOI layer 16, exposing a sub-surface (i.e., recessed surface) of the SOI layer 16 which is located beneath the top surface of the SOI layer 16. By "sub-surface" it is meant a surface of a material that is located between a topmost surface and a bottommost surface of the same material. The anisotropic etch provides a thinned SOI portion 16P underneath the opening 54 for formation of fully-depleted FETs. The thickness $T_1$ of the thinned SOI portion 16P can be from 3 nm to 10 nm, although lesser and greater thicknesses can also be employed.

After vertical extension of the gate cavity 52, the remaining portions of the doped extension layer 30 are herein referred to as source/drain extension regions 30E, and the remaining portions of the dopant diffusion barrier layer 20 are herein referred to as doped diffusion barrier portions 20P. In one embodiment, the sidewalls of the source/drain extension regions 30E and the doped diffusion barrier portions 20P are vertically coincident with the inner sidewalls of the gate spacer 38. The raised source/drain regions 40, the source/drain extension regions 30E and the doped diffusion barrier portions 20P together constitute source/drain regions of a FET.

Figure 8:
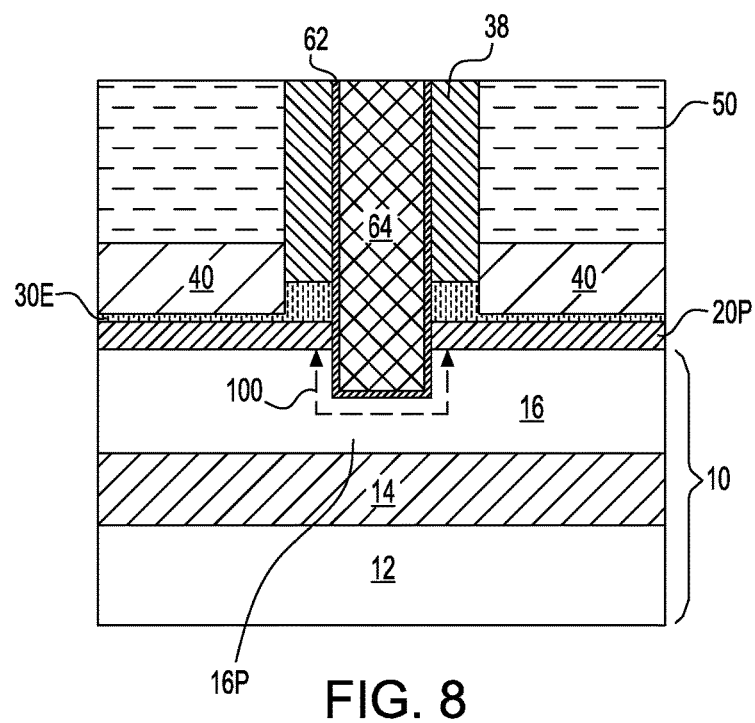
FIG. 8 is a cross-sectional view of the exemplary semiconductor structure of FIG. 7 after forming a functional gate stack in the gate cavity and the opening.

Referring to FIG. 8, a functional gate stack is formed in the gate cavity 52 and the opening 54. The functional gate stack includes a gate dielectric 62 and a gate electrode 64 overlying the gate dielectric 62.

The functional gate stack (62, 64) can be formed by first depositing a conformal gate dielectric layer (not shown) on the bottom surface of the opening 54, the sidewalls of the gate cavity 52 and the opening 54 and the top surface of the ILD layer 50. The gate dielectric layer can be a high dielectric constant (high-k) material layer having a dielectric constant greater than 8.0. Exemplary high-k materials include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In one embodiment, the gate dielectric layer includes $HfO_2$. The gate dielectric layer can be formed by a conventional deposition process including, but not limited to, CVD, PVD or ALD. The gate dielectric layer that is formed may have a thickness ranging from 0.9 nm to 6 nm, although lesser and greater thicknesses can also be employed. The gate dielectric layer may have an effective oxide thickness on the order of or less than 1 nm.

The remaining volume of the gate cavity 52 and the opening 54 is then filled with a gate electrode layer (not shown). The gate electrode layer can include any conductive material that may be a doped semiconductor material or a metallic material, such as, for example, tungsten, titanium, tantalum, aluminum, nickel, ruthenium, palladium and platinum. In one embodiment, the gate electrode layer is comprised of tungsten.

The gate electrode layer can be formed utilizing a conventional deposition process including, for example, CVD, PECVD, PVD or ALD. When silicon-containing materials are used as the gate electrode layer, the silicon-containing materials can be doped with an appropriate impurity by utilizing either an in-situ doping deposition process or by utilizing deposition, followed by a step such as ion implantation or gas phase doping in which the appropriate impurity is introduced into the silicon-containing material.

In some embodiment of the present application, prior to the formation of the gate electrode layer, a work function metal layer (not shown) may be conformally deposited over the gate dielectric layer employing ALD, CVD, sputtering or plating. The work function metal layer includes a metal having a work function suitable to tune the work function of the FET. The thickness of the work function metal layer can be from 3 nm to 15 nm, although lesser and greater thicknesses can also be employed. The work function metal layer may include, but is not limited to titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide including but not limited to titanium carbide (TiC) titanium aluminum carbide (TiAlC), tantalum carbide (TaC) and hafnium carbide (HfC), and combinations thereof.

Portions of the gate electrode layer and the gate dialectic layer that are formed above the top surface of the ILD layer 50 can be removed, for example, by CMP. The remaining portion of the gate electrode layer constitutes the gate electrode 64, and the remaining portion of the gate dielectric layer constitutes the gate dielectric 62.

In some embodiments of the present application, the gate dielectric 62 and the gate electrode 64 may be recessed utilizing a dry etch or a wet etch to provide a void (not shown) in the gate cavity 52. A gate cap material is then deposited within the void to form a gate cap (not shown) over the gate dielectric 62 and the gate electrode 64. The top surface of the gate cap can be coplanar with the top surface of the ILD layer.

A fully-depleted MOSFET is thus formed. The fully-depleted MOSFET includes a functional gate stack (62, 64) and source/drain regions (20P, 30E, 40) laterally surrounding the functional gate stack (62, 64). The functional gate stack (62, 64) extends partially into an SOI layer 16 of an SOI substrate 10, contacting a thinned SOI portion 16P of the SOI layer 16. The source/drain regions (20P, 30E, 40) include vertical stacks of, from bottom to top, dopant diffusion barrier portions 20P, source/drain extension regions 30E and raised source/drain regions 40. In the present application, since the opening 54 extends partially into the SOI layer 16 and thus forming a U-shaped groove in the SOI layer 16, after forming the functional gate stack (62, 64) therein, a channel 100 that is created linking the source/drain regions (20P, 30E, 40) also has a U-shaped geometry (also called U-shaped channel). The U-shaped channel 100 in the fully-depleted MOSFET can effectively minimize short channel effects. In addition, by introducing dopant diffusion barrier portions 20P between the U-shaped channel 100 and the source/drain extension regions 30E to block the unwanted diffusion of dopants from the source/drain extension regions 30E into the U-shaped channel 100, shorting of the source/drain extension regions 30E caused by the dopant diffusion can be avoided.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   a functional gate stack extending partially into a semiconductor-on-insulator (SOI) layer of an SOI substrate, wherein a bottom portion of the functional gate stack is embedded in the SOI layer and surrounded by an upper portion of the SOI layer;
   a gate spacer located on sidewalls of an embedded portion of the functional gate stack; and
   source/drain regions located entirely above a topmost surface of the SOI layer and on opposite sides of the unembedded portion of the functional gate stack, wherein each of the source/drain regions comprises a dopant diffusion barrier of uniform thickness composed of a carbon doped semiconductor material and directly contacting an entirety of the topmost surface of the SOI layer and contacting a sidewall of the unembedded portion of the functional gate stack, and a source/drain extension region located on an entirety of a topmost surface of the dopant diffusion barrier, wherein the source/drain extension region has a first portion of a first thickness that is located directly beneath the gate spacer and a sidewall that is vertically aligned with an inner sidewall of the gate spacer and a second portion adjacent to the first portion that has a second thickness that is less than the first thickness.

2. The semiconductor structure of claim 1, wherein the dopant diffusion barrier is composed of carbon doped silicon.

3. The semiconductor structure of claim 1, wherein each of the source/drain regions further comprises a raised source/drain region located directly on the second portion of the source/drain extension region.

4. The semiconductor structure of claim 1, wherein the raised source/drain region laterally contacts an outer sidewall of the gate spacer.

5. The semiconductor of claim 1, wherein the functional gate stack overlies and contacts a thinned SOI portion having a thickness less than a thickness of a remaining portion of the SOI layer located beneath the dopant diffusion barrier.

6. The semiconductor structure of claim 5, wherein the thinned SOI portion has a thickness ranging from 3 nm to 8 nm.

7. The semiconductor structure of claim 1, wherein the functional gate stack comprises:
   a U-shaped gate dielectric in contact with the inner sidewall of the gate spacer, the source/drain extension regions and the dopant diffusion barrier, and sidewalls and a bottom surface of an opening within the SOI layer; and
   a gate electrode located within the U-shaped gate dielectric and in contact with a bottom surface and inner sidewalls of the U-shaped gate dielectric.

8. The semiconductor structure of claim 3, wherein the raised source/drain region comprises dopants of conductivity type the same as dopants in the source/drain extension region.

9. The semiconductor structure of claim 8, wherein each of the raised source/drain region and the source/drain extension region is composed of boron doped SiGe.

10. The semiconductor structure of claim 8, wherein each of the raised source/drain region and the source/drain extension region is composed of phosphorus doped Si.

11. The semiconductor structure of claim 1, further comprising an interlevel dielectric (ILD) layer located on topmost surfaces of the source/drain regions, wherein the ILD layer laterally surrounds the gate spacer.

12. The semiconductor structure of claim 1, wherein a bottommost surface of the functional gate stack is located below bottommost surfaces of the dopant diffusion barrier.

13. The semiconductor structure of claim 12, wherein the bottommost surface of the functional gate stack is in direct contact with a recessed surface of the SOI layer.

14. The semiconductor structure of claim 13, the recessed surface of the SOI layer is located below the topmost surface of the SOI layer.

* * * * *